United States Patent
Iyer et al.

(10) Patent No.: US 6,423,631 B1
(45) Date of Patent: Jul. 23, 2002

(54) ISOLATION USING AN ANTIREFLECTIVE COATING

(75) Inventors: Ravi Iyer, Boise; Steven M. McDonald, Meridian; Thomas R. Glass, Idaho City; Zhiping Yin, Boise, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/625,164

(22) Filed: Jul. 25, 2000

Related U.S. Application Data

(63) Continuation of application No. 08/916,276, filed on Aug. 22, 1997, now Pat. No. 6,121,133.

(51) Int. Cl.[7] .................... H01L 21/4763; H01L 21/033
(52) U.S. Cl. ....................... 438/636; 438/225; 438/424; 257/510
(58) Field of Search ................................ 438/636, 424, 438/225; 257/510

(56) References Cited

U.S. PATENT DOCUMENTS

| | | | |
|---|---|---|---|
| 4,352,724 A | * 10/1982 | Sugishima et al. ......... 204/192 |
| 4,451,969 A | 6/1984 | Chaudhuri | |
| 4,764,248 A | 8/1988 | Bhattacherjee et al. | |
| 4,921,572 A | 5/1990 | Roche | |
| 5,216,542 A | 6/1993 | Szczyrbowski et al. | |
| 5,374,585 A | 12/1994 | Smith et al. | |
| 5,418,019 A | 5/1995 | Chen et al. | |
| 5,441,914 A | 8/1995 | Taft et al. | |
| 5,510,271 A | 4/1996 | Rohatgi et al. | |
| 5,539,249 A | 7/1996 | Roman et al. | |

(List continued on next page.)

FOREIGN PATENT DOCUMENTS

| | | | |
|---|---|---|---|
| JP | 61-59820 | 3/1986 | |
| JP | 3-101147 | 4/1991 | |
| JP | 8-31811 | 8/1996 | |
| JP | 8-31812 | 8/1996 | |
| JP | 09-134914 | 9/1997 | |
| WO | WO 99/10918 | * 3/1999 | ......... H01L/21/033 |

OTHER PUBLICATIONS

C. Bencher et al., "Dielectric antireflective coatings for DUV lithography", *Solid State Technology*, pp. 109, 111–112, and 114 (1997).

(List continued on next page.)

*Primary Examiner*—Charles Bowers
*Assistant Examiner*—David S Blum
(74) *Attorney, Agent, or Firm*—Mueting, Raasch & Gebhardt, P.A.

(57) ABSTRACT

A method of forming an oxidation diffusion barrier stack for use in fabrication of integrated circuits includes forming an inorganic antireflective material layer on a semiconductor substrate assembly with an oxidation diffusion barrier layer then formed on the inorganic antireflective material layer. Another method of forming such a stack includes forming a pad oxide layer on the semiconductor substrate assembly with an inorganic antireflective material layer then formed on the pad oxide layer and an oxidation diffusion barrier layer formed on the antireflective material layer. Another method of forming the stack includes forming a pad oxide layer on the semiconductor substrate assembly. A first oxidation diffusion barrier layer is then formed on the pad oxide layer, an inorganic antireflective material layer is formed on the first oxidation diffusion barrier layer, and a second oxidation diffusion barrier layer is formed on the inorganic antireflective material layer. The antireflective material layer may include a layer of material selected from the group of silicon nitride, silicon oxide, and silicon oxynitride and further may be a silicon-rich layer. The oxidation diffusion barrier stacks may be used for oxidation of field regions for isolation in an integration circuit. Further, the various oxidation diffusion barrier stacks are also described.

47 Claims, 10 Drawing Sheets

U.S. PATENT DOCUMENTS

| | | | |
|---|---|---|---|
| 5,580,815 A | | 12/1996 | Hsu et al. |
| 5,639,687 A | * | 6/1997 | Roman et al. .............. 438/636 |
| 5,677,111 A | | 10/1997 | Ogawa |
| 5,698,352 A | | 12/1997 | Ogawa et al. |
| 5,710,067 A | | 1/1998 | Foote et al. |
| 5,716,535 A | | 2/1998 | Lee et al. |
| 5,747,388 A | | 5/1998 | Kësters et al. |
| 5,766,964 A | | 6/1998 | Rohatgi et al. |
| 5,796,151 A | | 8/1998 | Hsu et al. |
| 5,886,391 A | * | 3/1999 | Niroomand et al. ........ 257/510 |
| 5,994,217 A | | 11/1999 | Ng |
| 6,103,456 A | | 8/2000 | Tëbben et al. |
| 6,117,741 A | | 9/2000 | Chatterjee et al. |
| 6,121,133 A | | 9/2000 | Iyer et al. |
| 6,124,178 A | | 9/2000 | Sung et al. |
| 6,174,590 B1 | | 1/2001 | Iyer et al. |
| 6,127,262 A1 | | 4/2001 | Huang et al. |

OTHER PUBLICATIONS

T. Gocho et al., "CVD Method of Anti–Reflective Layer Film for Excimer Laser Lithography", *Int. Conf. On Solid State Devices & Materials*, Makuhari, Aug. 29–Sep. 1, pp. 570–572 (1993).

T.P. Ong et al., "CVD $SiN_x$ Anti–reflective Coating for Sub–$0.5\mu m$ Lithography", Symposium on VLSI Technology Digest of Technical Papers, pp. 73–74 (1995).

Wolf, S., "Silicon Processing for the VLSI Era", *The Submicron Mosfet*, 3, 339–341 (1995).

Dammel et al., "Dependence Of Optical Contants Of AZ®BARLi™ Bottom Coating On Bake Conditions," *SPIE3049*:963–973 (1997).

Heavens, *Optical Properties of Thin Solid Films*, Dover Publications, Inc., New York, NY, 48–49 (1955).

Jenkins et al., *Fundamentals of Optics*, McGraw–Hill Book Company, Inc., New York, NY Section 1.4; 9–10 (1957).

Yin, "Chapter 5. Density and Composition of a–$Si_xN_yH_z$ Films, " *Optical Properties of Amorphous Silicon Nitride Films*, a dissertation submitted to the Graduate Faculty of The City University of New York, 70–91 (1991).

* cited by examiner

ISOLATION USING AN ANTIREFLECTIVE COATING

This is a continuation of application Ser. No. 08/916,276, filed Aug. 22, 1997, U.S. Pat. No. 6,121,133 which is incorporated herein by reference.

FIELD OF THE INVENTION

The present invention relates to the fabrication of integrated circuits. More particularly, the present invention relates to the use of antireflective layers in isolation processes.

BACKGROUND OF THE INVENTION

One of the most important processes in the fabrication of semiconductor integrated circuits (ICs) is photolithography. Optical photolithography involves reproducing an image from an optical mask in a layer of photoresist that is supported by underlying layers of a semiconductor substrate assembly. Photolithography is one of the most complicated and critical processes in the fabrication of ICs. The ability to reproduce precise images in a photoresist is crucial to meeting demands for increasing device density.

In the photolithographic process, first, an optical mask is positioned between a radiation source and the photoresist layer on the underlying layers. The radiation source can be, for example, visible light or ultraviolet radiation. Then, the image is reproduced by exposing the photoresist to radiation through the optical mask. Portions of the mask contain an opaque layer, such as, for example, chromium, that prevents exposure of the underlying photoresist. Remaining portions of the mask are transparent, allowing exposure of the underlying photoresist.

The layers underlying the photoresist layer, generally include one or more individual layers that are to be patterned. That is, when a layer is patterned, material from the layer is selectively removed. The ability to pattern layers of material enables ICs to be fabricated. In other words, the patterned layers are used as building blocks in individual devices of the IC. Depending on the type of photoresist utilized (i.e., positive type or negative type), exposed photoresist is either removed when the substrate is contacted with a developer solution, or the exposed photoresist becomes more resistant to dissolution in the developer solution. Thus, a patterned photoresist layer is able to be formed on underlying layers.

One of the problems experienced with conventional optical photolithography is the difficulty of obtaining uniform exposure of photoresist underlying transparent portions of the mask. It is desired that the light intensity exposing the photoresist be uniform to obtain optimum results.

When sufficiently thick layers of photoresist are used, the photoresist must be (or become) partially transparent upon exposure, so that photoresist at the surface of underlying layers is exposed to a substantially similar extent as the photoresist at the outer surface. Often, however, light that penetrates the photoresist is reflected back toward the light source from the surface of the underlying layers of the substrate assembly. The angle at which the light is reflected is dependent on the topography of the surface of the underlying layers and the type of material of the underlying layers. The reflected light intensity can vary in the photoresist throughout its depth or partially though its depth, leading to nonuniform exposure and undesirable exposure of the photoresist. Such exposure of the photoresist can lead to poorly controlled features (e.g., gates, metal lines, etc.) of the IC.

In an attempt to minimize the variable reflection of light in a photoresist layer, antireflective coatings have been utilized between the underlying layers of a substrate assembly and the photoresist layer or between the photoresist layer and the radiation source. Such antireflective coatings minimize photoresist exposure from surface reflections, allowing exposure across a photoresist layer to be controlled more easily from the radiation incident on the photoresist from the radiation source.

Typically, antireflective coatings are organic materials. Organic layers can, however, lead to particle contamination in the integrated circuit (IC) due to the incomplete removal of organic material from the underlying layers after the photolithography step is performed. Such particle contamination can potentially be detrimental to the electrical performance of the IC. Further, the underlying layers upon which the organic materials are formed may be uneven resulting in different thicknesses of the organic material used as the antireflective coating, e.g., thicker regions of the organic material may be present at various locations of the underlying layers. As such, when attempting to remove such organic material, if the etch is stopped when the underlying layers are reached, then some organic material may be left. If the etch is allowed to progress to etch the additional thickness in such regions or locations, then the underlying layers may be undesirable etched (e.g., punchthrough of an underlying layer may occur).

Inorganic antireflective layers have also recently been introduced. For example, silicon-rich silicon dioxide, silicon-rich nitride, and silicon-rich oxynitride have been utilized as inorganic antireflective layers. Such inorganic antireflective layers have been utilized, for example, in the patterning of metal lines and polysilicon gates.

After a patterned photoresist layer is formed on a substrate, many other processes are typically performed in the fabrication of ICs. For example, the photoresist can act as an implantation barrier during an implant step. The photoresist can also be utilized to define the outer perimeter of an area (e.g., a contact hole) that is etched in the substrate or individual layers therein. Once again, the photoresist acts as a barrier during the etching process.

One common photolithographic process involves utilizing the patterned photoresist layer over a pad oxide layer and silicon nitride layer on a supporting substrate. The pad oxide layer is utilized as a stress buffer due to the volumetric increase of adjacent growing oxide and the large difference in thermal expansion coefficients of the silicon wafer and the silicon nitride layer that are problematic during subsequent thermal oxidation. The patterned photoresist layer is utilized to selectively remove the pad oxide layer and silicon nitride layer (e.g., LPCVD silicon nitride) in field regions of a substrate.

After such field regions are defined by the remaining regions of the pad oxide layer and the silicon nitride layer, the patterned photoresist layer is removed. Then, the field regions of the substrate are oxidized, for example, using a wet oxidation process, to form field oxide in the field regions. The silicon nitride layer acts as a barrier to oxygen diffusion, preventing oxidation in underlying active regions. This technique is well known as the LOCOS (Local Oxidation of Silicon) process. One recurring problem, however, with the LOCOS process is encroachment of field oxide under the edges of the silicon nitride in the active regions. This is often referred to as the "bird's beak" phenomenon. As device density increases, the bird's beak problem becomes more problematic because the active region containing the bird's beak is essentially unusable for the fabrication of devices.

Another well known electrical isolation technique is trench isolation. In trench isolation, a trench is etched in the substrate and then filled with deposited oxide. Trench isolation is referred to as shallow trench isolation (STI) or deep trench isolation (DTI), depending on the depth of the trench etched in the substrate. After the oxide is deposited to fill the trench, it is patterned so that the oxide is removed from areas of the substrate outside of the trench etched in the substrate. Conventional photolithography is utilized to pattern the oxide.

SUMMARY OF THE INVENTION

There is a need for methods of forming isolation regions for integrated circuits that are well-controlled. One way in which such processes can be better controlled is through improvement of the photolithographic steps used therein. For example, it is desirable to obtain a uniform level of exposure of photoresist used in patterning steps. The present invention provides various methods and structures using inorganic antireflective layers.

A method of forming an oxidation diffusion barrier stack for use in fabrication of integrated circuits in accordance with the present invention includes providing a semiconductor substrate assembly and forming an inorganic antireflective material layer on the semiconductor substrate assembly. An oxidation diffusion barrier layer is then formed on the inorganic antireflective material layer.

Another method of forming an oxidation diffusion barrier stack for use in the fabrication of integrated circuits in accordance with the present invention includes providing a semiconductor substrate assembly and forming a pad oxide layer on the semiconductor substrate assembly. An inorganic antireflective material layer is then formed on the pad oxide layer and an oxidation diffusion barrier layer is formed on the antireflective material layer.

In yet another method of forming an oxidation diffusion barrier stack for use in the fabrication of integrated circuits in accordance with the present invention includes providing a semiconductor substrate assembly and forming a pad oxide layer on the semiconductor substrate assembly. A first oxidation diffusion barrier layer is then formed on the pad oxide layer, an inorganic antireflective material layer is formed on the first oxidation diffusion barrier layer, and a second oxidation diffusion barrier layer is formed on the inorganic antireflective material layer.

In various embodiments of the methods, the semiconductor substrate assembly is a silicon substrate; the antireflective material layer includes a layer of material selected from the group of silicon nitride, silicon oxide, and silicon oxynitride; the antireflective material layer is a silicon-rich layer; the antireflective material has an index of refraction of about 1.7 to about 3.0; the antireflective material layer has an absorptive coefficient of about 0.2 to about 2.0; and/or the oxidation diffusion barrier layers may be layers of silicon nitride or silicon oxynitride.

Further, a method for use in forming isolation for an integrated circuit is provided. The method includes providing a semiconductor substrate and forming an oxidation diffusion barrier stack on the semiconductor substrate. The oxidation diffusion barrier stack includes an inorganic antireflective material layer. The oxidation diffusion barrier stack is patterned resulting in exposed regions of the semiconductor substrate and the exposed regions of the semiconductor substrate are oxidized.

An oxidation diffusion barrier stack in accordance with the present invention includes an inorganic antireflective material layer formed on a semiconductor substrate assembly and an oxidation diffusion barrier layer formed on the inorganic antireflective material layer.

Another oxidation diffusion barrier stack in accordance with the present invention includes a pad oxide layer formed on a semiconductor substrate, an oxidation diffusion barrier layer, and an inorganic antireflective material layered between the pad oxide and the oxidation diffusion barrier layer.

Yet another oxidation diffusion barrier stack in accordance with the present invention includes a first oxidation diffusion barrier layer, a second oxidation diffusion barrier layer, and an inorganic antireflective material layered between the first and second oxidation diffusion barrier layers.

In various embodiments of the stacks, the inorganic antireflective material may be selected from the group of silicon-rich silicon oxide, silicon-rich silicon nitride, and silicon-rich silicon oxynitride; and/or oxidation diffusion barrier layers may be silicon nitride layers or silicon oxynitride layers.

BRIEF DESCRIPTION OF THE DRAWING

The following figures are provided for ease of description and understanding of the invention. Thus, scaling and dimensions in the figures are not exact.

DETAILED DESCRIPTION OF THE EMBODIMENTS

Figure 1A:
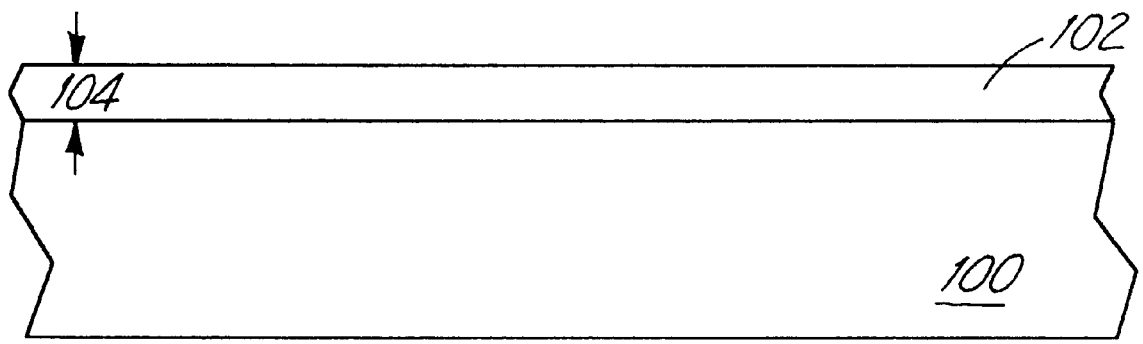
FIG. 1A is a cross-sectional representation of a pad oxide layer supported by a semiconductor substrate.

To provide better controlled photolithography when forming electrical isolation in an integrated circuit (IC), an antireflective coating (ARC) is used. Using an ARC results in uniform exposure to photoresist which has been formed on underlying layers of a substrate assembly. Thus, well-defined patterns are able to be reproduced in the photoresist. Forming well-defined patterns in the photoresist leads to well-defined patterning of underlying material. As device density is increasing, such precise definition is becoming increasingly important.

It is to be understood that the term substrate assembly, as used herein, includes a wide variety of semiconductor-based structures, including but not limited to a semiconductor substrate and a semiconductor substrate having one or more layers, regions formed thereon or therein. Semiconductor substrates can be a single layer of material, such as a silicon wafer or is understood to include silicon-on-sapphire (SOS) technology, silicon-on-insulator (SOI) technology, doped and undoped semiconductors, epitaxial layers of silicon supported by a base semiconductor, as well as other semiconductor substrate structures. When reference is made to a semiconductor substrate assembly in the following description, various process steps may have been utilized to form regions/junctions in a semiconductor substrate or may have been used to form one or more layers or regions of material relative to the substrate.

ARCs according to the present invention are preferably inorganic. Such preferred inorganic ARCs are formed between a photoresist layer and underlying layers for use in photolithography. Suitable ARC materials according to the present invention include a nonstoichiometric silicon-rich oxide, silicon-rich nitride, and silicon-rich oxynitride. A preferred chemical formula of the silicon-rich oxide is $SiO_x$, where X is in the range of about 0.3 to about 1.9. A preferred chemical formula of the silicon-rich nitride is $SiN_y$, where y is in the range of about 0.2 to about 1.0. A preferred chemical formula of the silicon-rich oxynitride is $SiO_xN_y$, where x is in the range of about 0.2 to about 1.9 and y is in the range of about 0.01 to about 1.0.

Further, suitable ARC materials generally have an index of refraction of about 1.7 to about 3.0 and an absorptive coefficient of about 0.2 to about 2.0 at a wavelength of about 248 nanometers. Preferably, the index of refraction is about 2.0 to about 2.7 and the absorptive coefficient is about 0.4 to about 1.5 at a wavelength of about 248 nanometers. The absorptive coefficient needed depends on the index of refraction and the absorptive coefficient of the photoresist and other underlying layers of the substrate assembly upon which the photoresist is formed, as well as the dimensions of the underlying substrate assembly features and layers. Depending on the wavelength, as the amount of silicon in the nonstoichiometric ARC materials increase, the index of refraction and the absorptive coefficient of the ARC material typically increase as well. For example, this is generally the case for a wavelength of about 365 nanometers.

A layer of ARC material is formed on a substrate assembly using chemical vapor deposition (CVD). Preferably, plasma-enhanced chemical vapor deposition (PECVD) is used. PECVD allows formation of the layer at relatively low temperatures of about 400° C. By controlling flow rates of certain precursor gases, material of the desired stoichiometry can be formed on the substrate. For example, when more of a particular component is desired in the resulting material, the flow rate of the precursor gas of that component is increased or the flow rate of the other precursor gas(es) is decreased.

Silicon-rich oxide is formed by flowing a silicon-containing precursor gas and an oxygen-containing precursor gas in a process chamber. Typically, an inert carrier gas, for example, argon or helium, is used as well. The silicon-containing precursor gas may be any member of the silane family (e.g., silane, disilane, dichlorosilane, etc.). Preferably, the oxygen-containing precursor gas is nitrous oxide ($N_2O$); however, other oxygen-containing precursors, including $O_2$, NO, $N_2O_2$, and $NO_2$, may be utilized.

Silicon-rich nitride is formed by flowing a silicon-containing precursor gas and a nitrogen-containing precursor gas in a process chamber. Typically, a carrier gas, for example, nitrogen, is used as well. The silicon-containing precursor gas may be any member of the silane family (e.g., silane, disilane, dichlorosilane, etc.). Preferably, the nitrogen-containing precursor gas is ammonia ($NH_3$); however, other nitrogen-containing precursor gases, such as nitrogen or a gas from the family of $[C_nH_{2n+1}]_2NH$ (e.g., $[CH_3]_2NH$), may be used.

Silicon-rich oxynitride is formed by flowing a silicon-containing precursor gas, an oxygen-containing precursor gas, and a nitrogen-containing precursor gas in a process chamber. Typically, a carrier gas, for example, nitrogen, is used as well. The silicon-containing precursor gas may be any member of the silane family (e.g., silane, disilane, dichlorosilane, etc.). Preferably, the oxygen-containing precursor gas is nitrous oxide ($N_2O$); however, for example, $O_2$, NO, $N_2O_2$, and $NO_2$, may be used. Preferably, the nitrogen-containing precursor gas is ammonia ($NH_3$); however, for example, nitrogen or a gas from the family of $[C_nH_{2n+1}]_2NH$, may be used.

When using an ARC material according to the present invention, a layer of the ARC material is formed in an oxidation diffusion barrier stack. Typically, the oxidation diffusion barrier stack is formed as a blanket layer over the supporting semiconductor structure. A layer of photoresist is then formed over the oxidation diffusion barrier stack. The photoresist is then exposed using conventional photolithography. After the photoresist is contacted with a developer solution, photoresist is selectively removed from the substrate surface according to the pattern exposed therein.

Next, the oxidation diffusion barrier stack is selectively etched in regions where the photoresist has been removed therefrom to pattern the stack. The etchant is selected according to the materials in the oxidation diffusion barrier stack. Preferably, a dry etch is used due to the ability of dry etchants to etch anisotropically. The various oxide and nitride layers described herein can be etched using any suitable etching technique. For example, reactive ion etching using a fluorine chemistry may be used to etch oxides and nitrides, e.g., a chemistry using a $CHF_3$ or $CF_4$. The type of gas flow can be easily controlled in a plasma reactor by selectively opening and closing mass controllers coupled to the plasma reactor. Thus, if the oxidation diffusion barrier stack includes more than one type of material, the stack can be etched in-situ due to the ability to selectively control the flow of gas.

Once the oxidation diffusion barrier stack is patterned, the exposed portions of the semiconductor substrate assembly (e.g., doped silicon, undoped silicon) can be oxidized. For field oxidation, wet oxidation is typically utilized to perform the oxidization. This process is well known to one of ordinary skill in the art. In such a process, for example, the substrate is placed in a furnace, ramped to a temperature of about 900° C. to about 1,150° C. Once the desired thickness of field oxide is grown, the temperature of the furnace is decreased and the substrate is removed from the furnace.

After the oxidation process, the patterned oxidation diffusion barrier stack is typically removed. Once again, a dry etch, as described above, is utilized.

In one embodiment of the present invention, the oxidation diffusion barrier stack is supported by a silicon wafer. As illustrated in FIG. 1A, a pad oxide layer 102 is formed on the silicon wafer 100. The silicon wafer 100 is typically doped (i.e., n-type or p-type), but it is not necessary for the practice of this invention. The thickness 104 of the pad oxide layer 102 is typically about a few hundred angstroms or less.

Figure 1B:
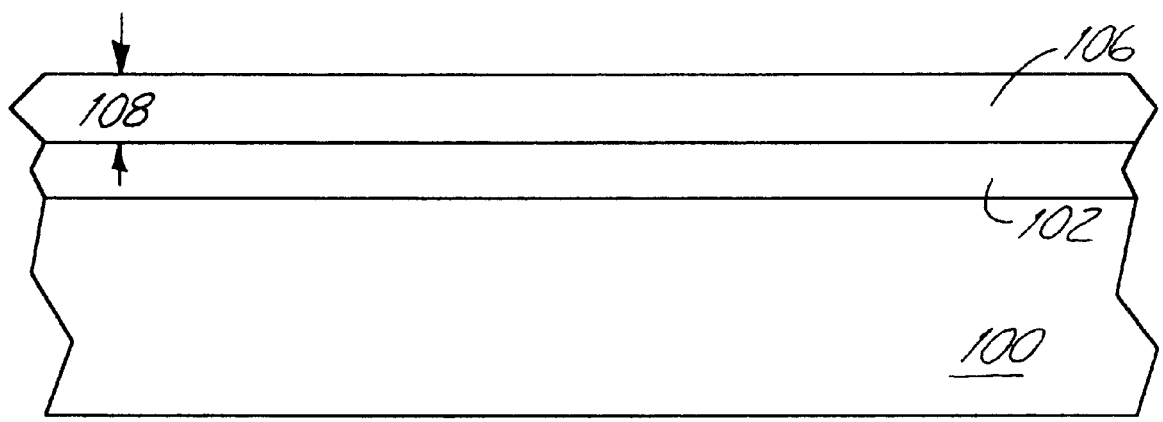
FIG. 1B is a cross-sectional representation of the structure of FIG. 1A, wherein an inorganic antireflective coating is formed thereon in accordance with the present invention.

Next, as illustrated in FIG. 1B, an ARC layer 106 is formed on the pad oxide layer 102. The thickness 108 of the ARC layer 106 is preferably about 100 Å A to about 500 Å. More preferably, the thickness 108 of the ARC layer 106 is about 250 Å to about 350 Å. Depending on the wavelength of incident radiation during photolithography and the dimensions of the oxidation diffusion barrier stack, however, the thickness 108 of the ARC layer 106 can vary.

Figure 1C:
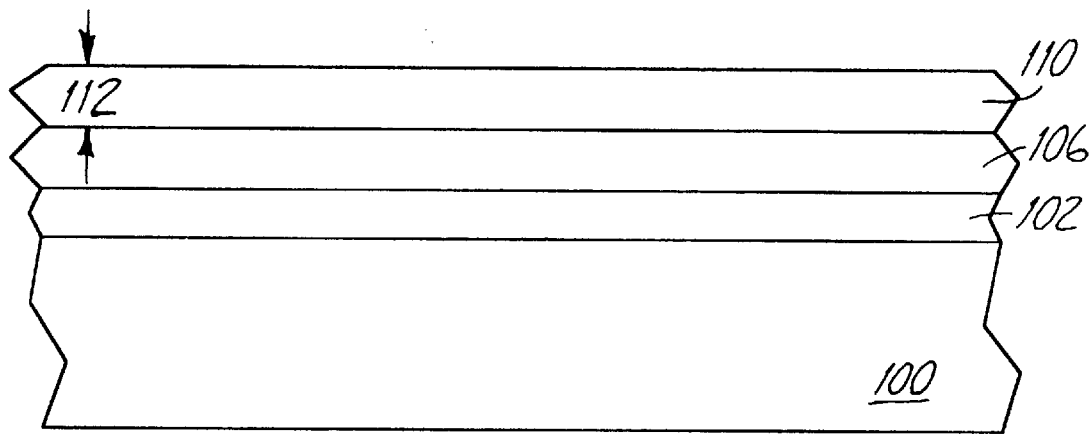
FIG. 1C is a cross-sectional representation of the structure of FIG. 1B, wherein a silicon nitride is formed thereon.

Then, as illustrated in FIG. 1C, a silicon nitride layer 110 is formed on the ARC layer 106. The thickness 112 of the silicon nitride layer 110 is preferably about 3000 Å or less. More preferably, the thickness 112 of the silicon nitride layer 110 is about 1000 Å to about 2400 Å. The silicon nitride layer 110 is preferably formed using low pressure chemical vapor deposition (LPCVD), for example, at a temperature of about 500° C. to about 750° C. It is to be appreciated that, while a silicon nitride layer is utilized in this illustration for the purpose of an oxidation diffusion material, any material known to prevent (or minimize) the diffusion of oxygen therethrough can be utilized in place of, or in addition to, the silicon nitride layer 110. For example, silicon oxynitride, boron nitride, and aluminum nitride may be used.

Figure 1D:
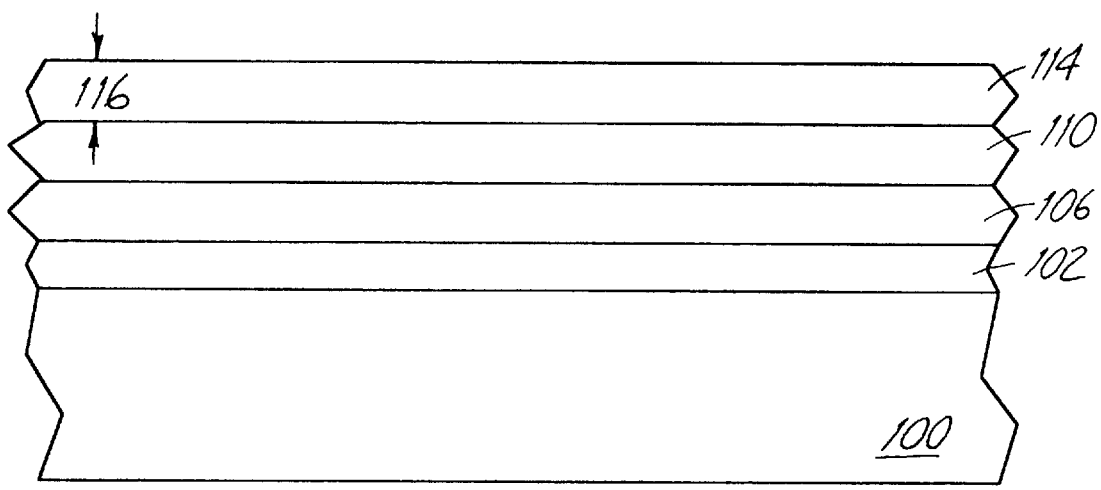
FIG. 1D is a cross-sectional representation of the structure of FIG. 1C, wherein a photoresist layer is formed thereon to pattern the underlying material.

Next, as illustrated in FIG. 1D, a photoresist layer 114 is formed on the silicon nitride layer 110. The thickness 116 of the photoresist layer 114 is typically about 7000 Å to about 10,000 Å. The minimum thickness 116 of the photoresist layer 114 is governed by the need to have the patterned photoresist layer 114 remain after a subsequent etching step, when the oxidation diffusion barrier stack is selectively removed from the silicon wafer 100 in exposed regions underlying the patterned photoresist layer.

Figure 1E:
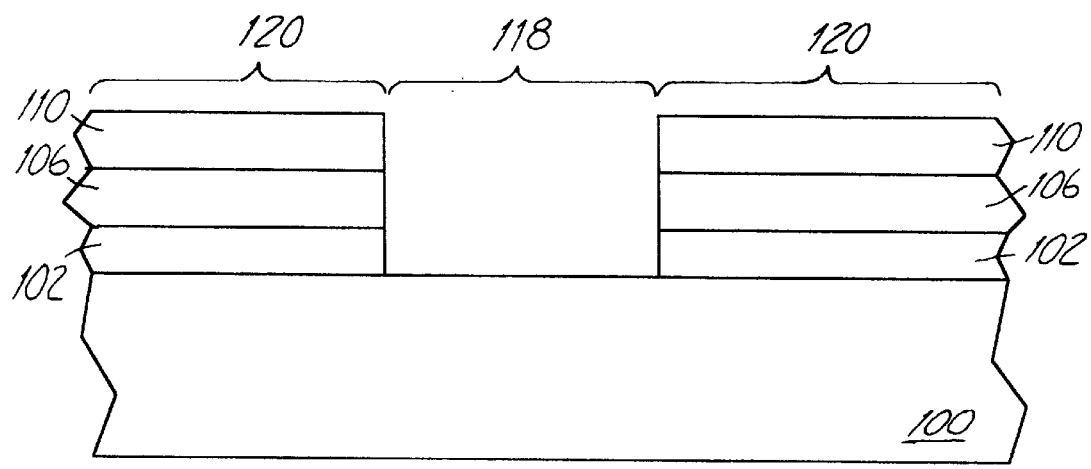
FIG. 1E is a cross-sectional representation of the structure of FIG. 1D, wherein the underlying stack of silicon nitride, antireflective coating, and pad oxide layers have been patterned.

The oxidation diffusion barrier stack is etched according to the technique previously described and the photoresist layer 114 is removed, resulting in the structure illustrated in FIG. 1E. The photoresist layer 114 is removed according to well known methods to one of ordinary skill in the art. For example, an oxygen ash can be used to remove the photoresist layer 114. Regions where the oxidation diffusion barrier stack is etched to the underlying silicon wafer 100 are field regions 118. Regions where the patterned oxidation diffusion barrier stack remains on the silicon wafer 100 are active regions 120. Individual or multiple active devices can subsequently be formed in the active regions 120 of the substrate 100, as is readily known to one skilled in the art.

Figure 1F:
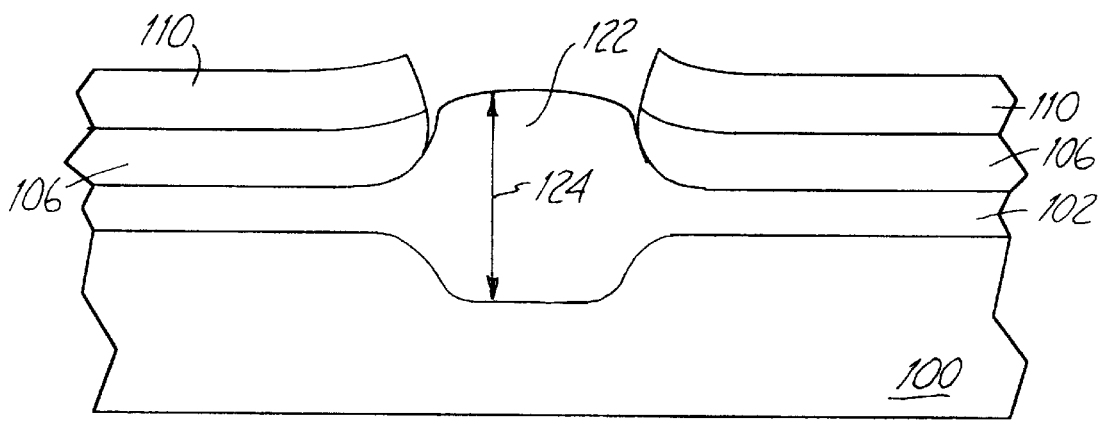
FIG. 1F is a cross-sectional representation of the structure of FIG. 1E, wherein field oxide is formed in field regions of the substrate between the patterned stack.

Field oxide 122 is then formed in the field regions 118, resulting in the structure illustrated in FIG. 1F. The thickness 124 of the field oxide 122 is governed by the device density and operating voltages of individual devices later formed in the active regions 120 illustrated in FIG. 1E. Typically, the thickness 124 of the field oxide 122 is about a few thousand angstroms. The thickness 124 of the field oxide 122, however, is not critical to the practice of this invention.

Figure 2A:
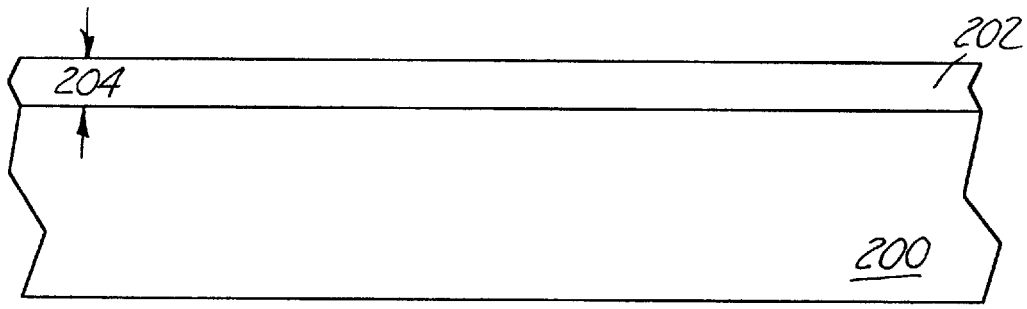
FIG. 2A is a cross-sectional representation of a pad oxide layer supported by a semiconductor substrate.

In another embodiment of the invention, a pad oxide layer 202 is formed on the silicon wafer 200, as illustrated in FIG. 2A. The silicon wafer 200 is typically doped (i.e., n-type or p-type), but it is not necessary for the practice of this invention. The thickness 204 of the pad oxide layer 202 is typically about a few hundred angstroms or less.

Figure 2B:
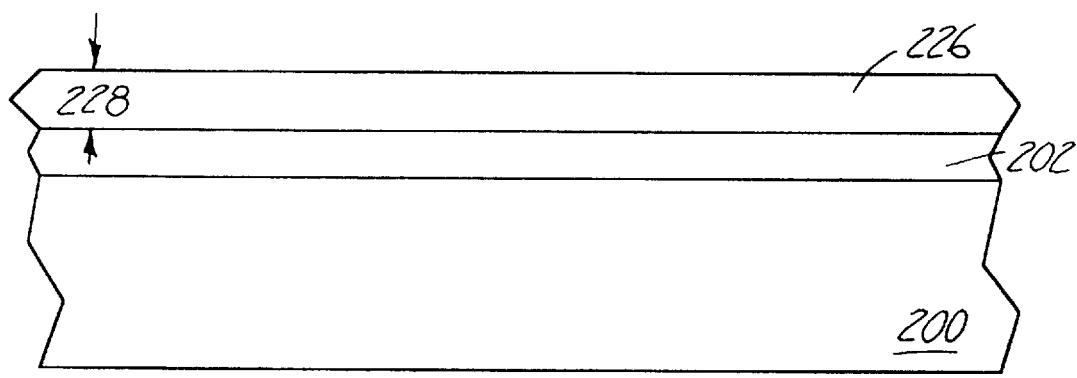
FIG. 2B is a cross-sectional representation of the structure of FIG. 2A, wherein a first silicon nitride layer is formed thereon.

Next, as illustrated in FIG. 2B, a first silicon nitride layer 226 is formed on the pad oxide layer 202. The thickness 228 of the first silicon nitride layer 226 is preferably small enough that the first silicon nitride layer 226 does not delaminate from the pad oxide layer 202. More preferably the thickness 228 of the first silicon nitride layer 226 is about 1,500 Å or less. Even more preferably, the thickness 228 of the first silicon nitride layer 226 is about 50 Å to about 1,500 Å. Most preferably, the thickness 228 of the first silicon nitride layer 226 is about 300 Å to about 1000 Å. The first silicon nitride layer 226 can be formed using techniques well known to one of ordinary skill in the art. Preferably, one of PECVD and LPCVD is used to form the first silicon nitride layer 226. More preferably, PECVD is used.

Figure 2C:
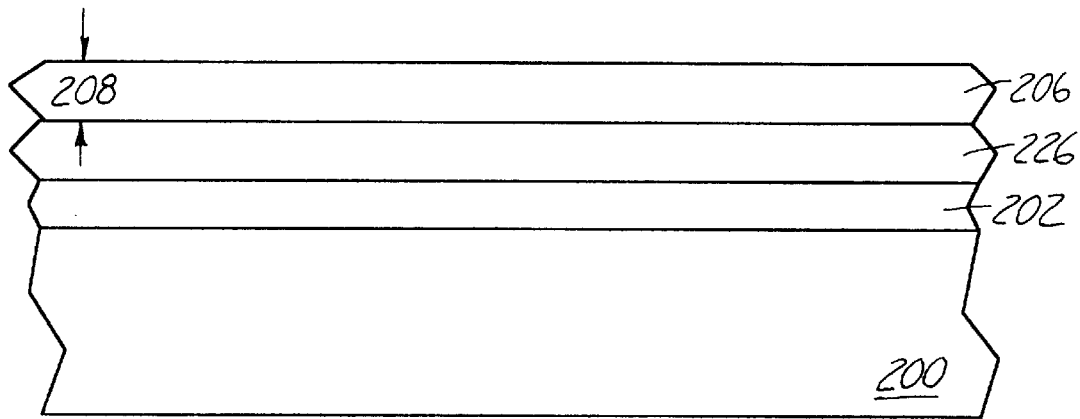
FIG. 2C is a cross-sectional representation of the structure of FIG. 2B, wherein an antireflective layer is formed thereon.

Then, an ARC layer 206 is formed on the first silicon nitride layer 226, as illustrated in FIG. 2C. The thickness 208 of the ARC layer 206 is about 100 Å to about 500 Å. Preferably, the thickness 208 of the ARC layer 206 is about 200 Å to about 350 Å. Depending on the wavelength of incident radiation during photolithography and the dimensions of the oxidation diffusion barrier stack, however, the thickness 208 of the ARC layer 206 can vary.

Figure 2D:
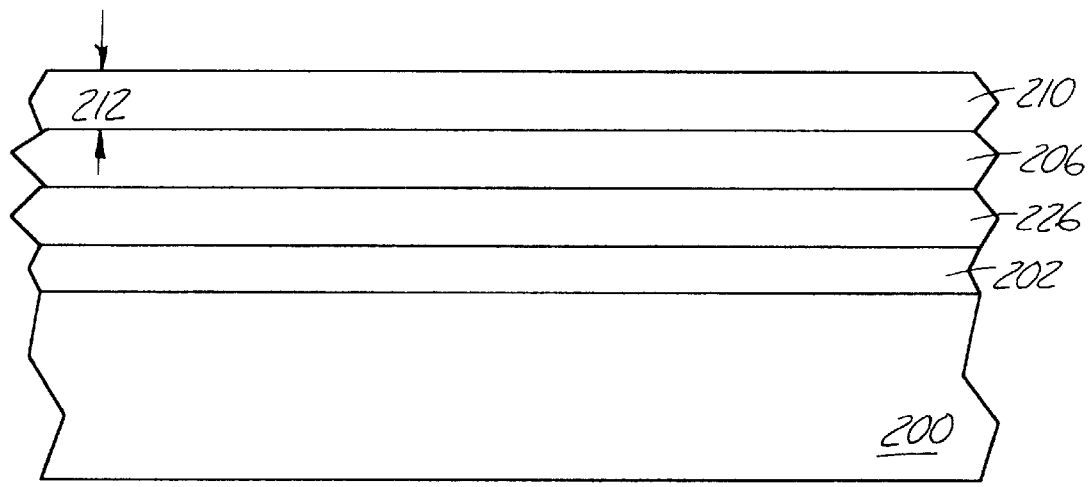
FIG. 2D is a cross-sectional representation of the structure of FIG. 2C, wherein a second silicon nitride layer is formed thereon.

Then, as illustrated in FIG. 2D, a second silicon nitride layer 210 is formed on the ARC layer 206. The thickness 212 of the second silicon nitride layer 210 is preferably about 3,000 Å or less. More preferably, the thickness 212 of the second silicon nitride layer 210 is selected such that a total thickness of the first and second silicon nitride layers 226 and 210, respectively, is about 1,000 Å to about 2,000 Å. The second silicon nitride layer 110 is preferably formed using low pressure chemical vapor deposition (LPCVD). It is to be appreciated that, while silicon nitride is utilized for the first and second silicon nitride layers in this illustration for the purpose of an oxidation diffusion material, any material known to prevent (or minimize) the diffusion of oxygen therethrough can be utilized in place of, or in addition to, the first and second silicon nitride layers 226 and 210.

Figure 2E:
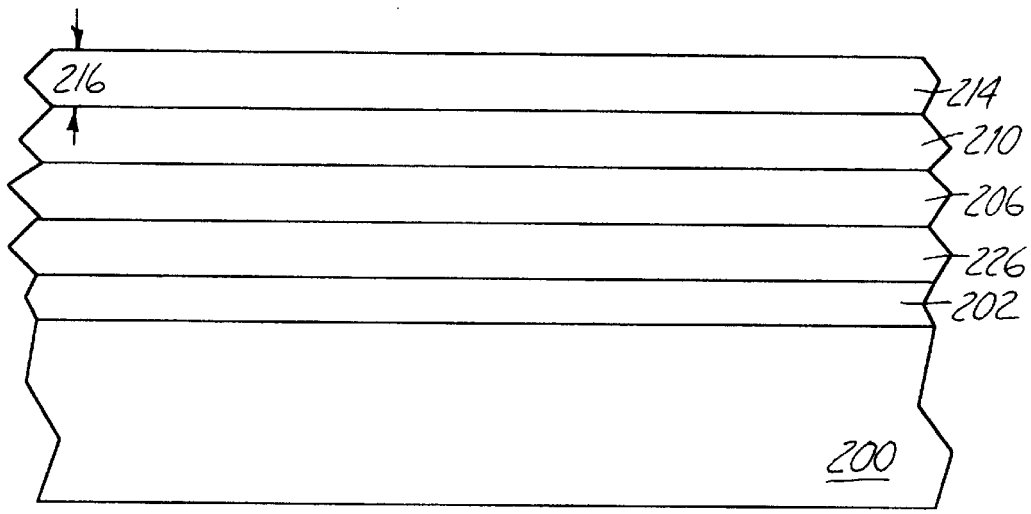
FIG. 2E is a cross-sectional representation of the structure of FIG. 2D, wherein a photoresist layer is formed thereon to pattern the underlying material.

Next, as illustrated in FIG. 2E, a photoresist layer 214 is formed on the second silicon nitride layer 210. The thickness 216 of the photoresist layer 214 is typically about a few thousand angstroms. The minimum thickness 216 of the photoresist layer 214 is governed by the need to prevent removal of the photoresist layer 214 through to the underlying layer during a subsequent etching step, where the oxidation diffusion barrier stack is selectively removed from the silicon wafer 200 in exposed regions underlying the photoresist layer 214.

Figure 2F:
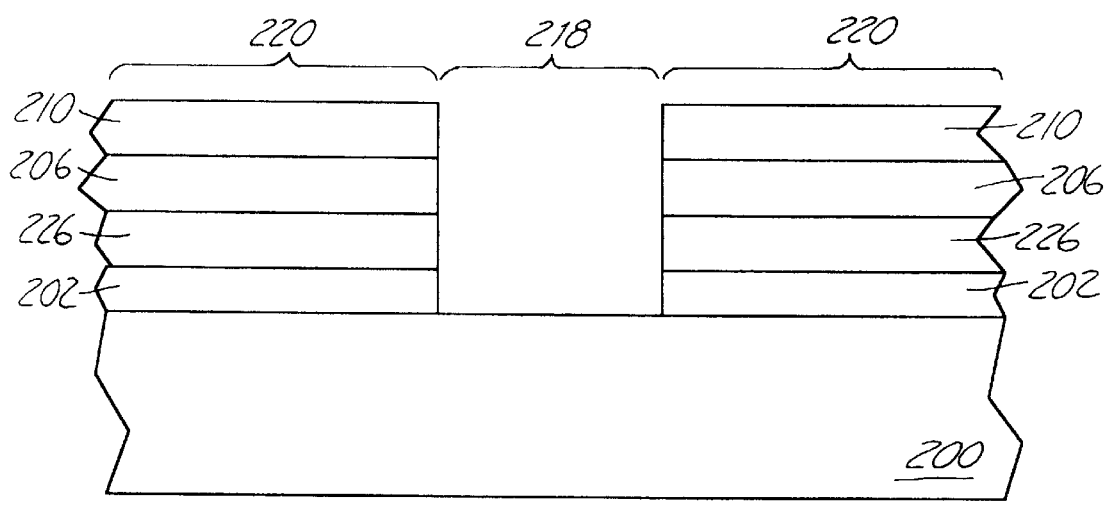
FIG. 2F is a cross-sectional representation of the structure of FIG. 2E, wherein the underlying stack of second silicon nitride, antireflective, first silicon nitride and pad oxide layers have been patterned.

The oxidation diffusion barrier stack is etched according to the technique previously described and the photoresist layer 214 is removed, resulting in the structure illustrated in FIG. 2F. The photoresist layer 214 is removed according to well known methods to one of ordinary skill in the art. For example, an oxygen ash can be used to remove the photoresist layer 214. Regions where the oxidation diffusion barrier stack is etched to the underlying silicon wafer 200 are field regions 218. Regions where the patterned oxidation diffusion barrier stack remains on the silicon wafer 200 are active regions 220. Individual or multiple active devices can subsequently be formed in the active regions 220 of the substrate 200.

Figure 2G:
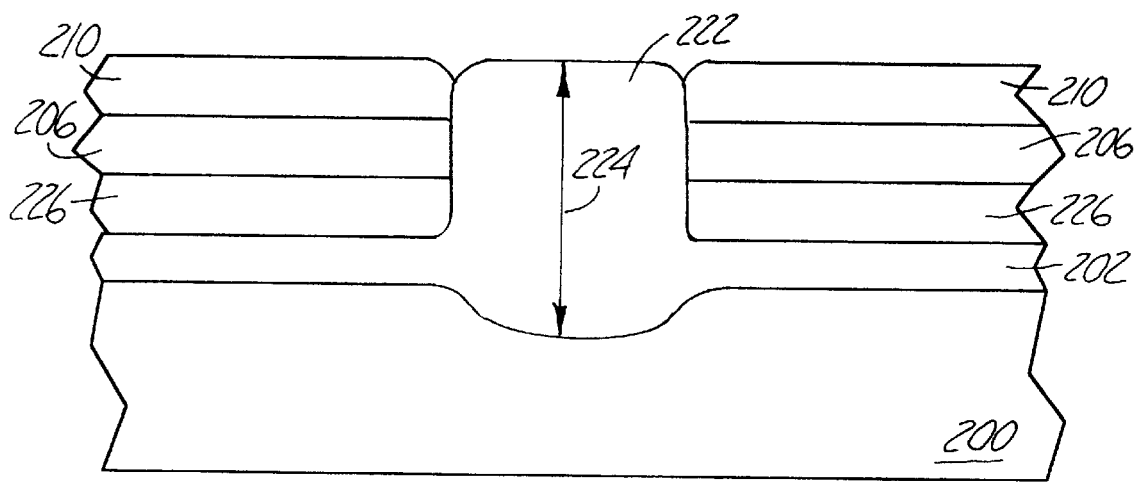
FIG. 2G is a cross-sectional representation of the structure of FIG. 2F, wherein field oxide is formed in field regions of the substrate between the patterned stack.

Field oxide 222 is then formed in the field regions 218, resulting in the structure illustrated in FIG. 2G. The thickness 224 of the field oxide 222 is governed by the device density and operating voltages of individual devices later formed in the active regions 220 illustrated in FIG. 2F. Typically, the thickness 224 of the field oxide 222 is about a few thousand angstroms. The thickness 224 of the field oxide 222, however, is not critical to the practice of this invention.

Figure 3A:
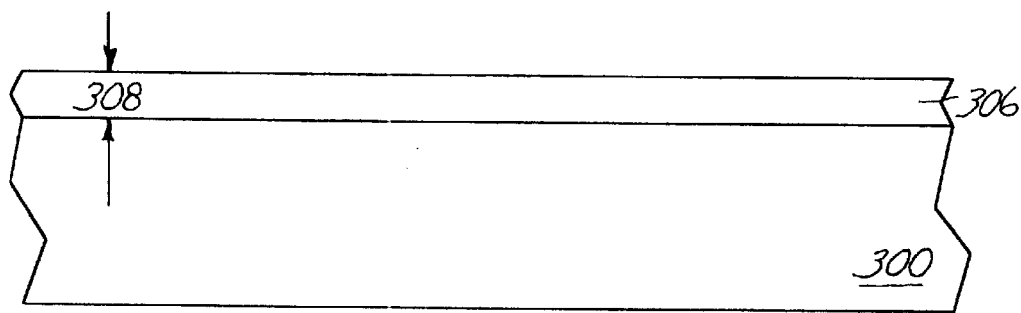
FIG. 3A is a cross-sectional representation of an antireflective layer supported by a semiconductor substrate.

In yet another embodiment, an ARC layer 306 is formed directly on the silicon wafer 300 as illustrated in FIG. 3A. The silicon wafer 300 is typically doped (i.e., n-type or p-type), but it is not necessary for the practice of this invention. The thickness 308 of the ARC layer 306 is about 100 Å to about 500 Å. Preferably, the thickness 308 of the ARC layer 306 is about 200 Å to about 400 Å. Depending on the wavelength of incident radiation during photolithography and the dimensions of the oxidation diffusion barrier stack, however, the thickness 308 of the ARC layer 306 can vary.

Figure 3B:
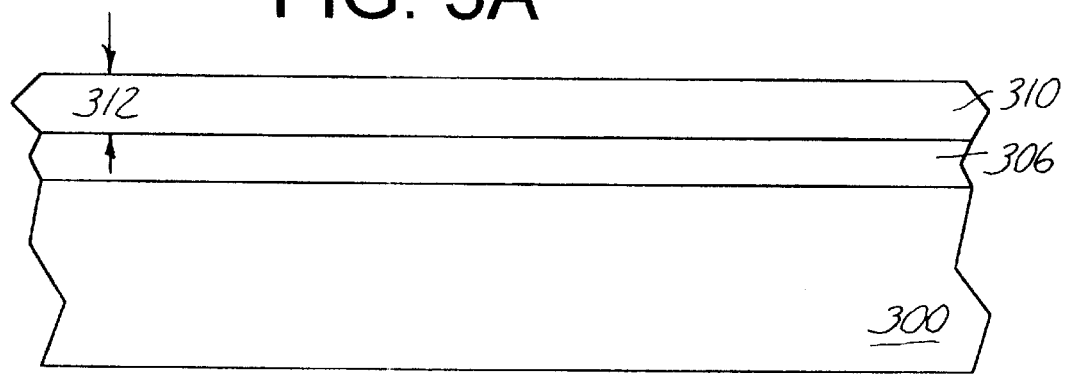
FIG. 3B is a cross-sectional representation of the structure of FIG. 3A, wherein a silicon nitride layer is formed thereon.

Then, as illustrated in FIG. 3B, a silicon nitride layer 310 is formed on the ARC layer 306. The thickness 312 of the silicon nitride layer 310 is preferably about 3000 Å or less. More preferably, the thickness 312 of the silicon nitride layer 310 is about 1000 Å to about 2000 Å. The silicon nitride layer 310 is preferably formed using low pressure chemical vapor deposition (LPCVD). It is to be appreciated that, while a silicon nitride layer is utilized in this illustration for the purpose of an oxidation diffusion material, any material known to prevent (or minimize) the diffusion of oxygen therethrough can be utilized in place of, or in addition to, the silicon nitride layer 310.

Figure 3C:
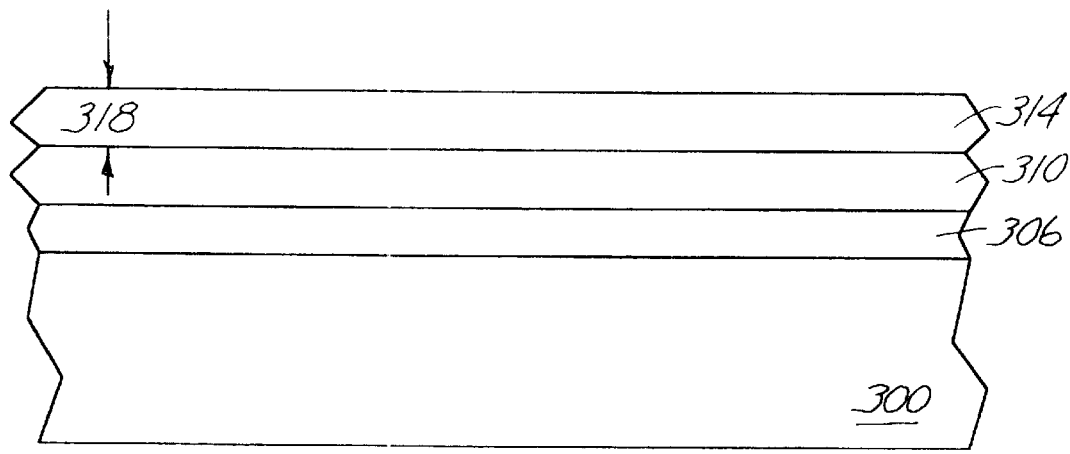
FIG. 3C is a cross-sectional representation of the structure of FIG. 3B, wherein a photoresist layer is formed thereon to pattern the underlying material.

Next, as illustrated in FIG. 3C, a photoresist layer 314 is formed on the silicon nitride layer 310. The thickness 3 16 of the photoresist layer 3 14 is typically about 7000 Å to about 10,000 Å. The minimum thickness 316 of the photoresist layer 314 is governed by the need to prevent removal of the photoresist layer 314 through to the underlying layer during a subsequent etching step, where the oxidation diffusion barrier stack is selectively removed from the silicon wafer 300 in exposed regions underlying the photoresist layer 314.

Figure 3D:
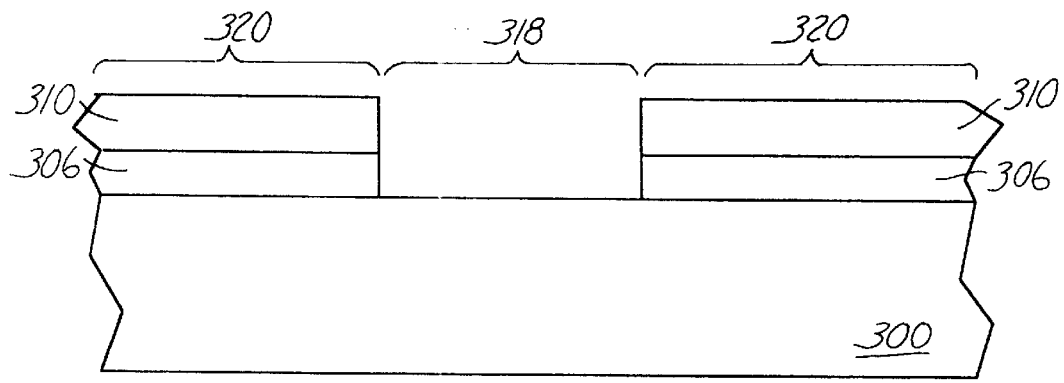
FIG. 3D is a cross-sectional representation of the structure of FIG. 3C, wherein the underlying stack of antireflective coating and silicon nitride layers have been patterned.

The oxidation diffusion barrier stack is etched according to the technique previously described and the photoresist layer 314 is removed, resulting in the structure illustrated in FIG. 3D. The photoresist layer 314 is removed according to well known methods to one of ordinary skill in the art. For example, an oxygen ash can be used to remove the photoresist layer 314. Regions where the oxidation diffusion barrier stack is etched to the underlying silicon wafer 300 are field regions 318. Regions where the patterned oxidation diffusion barrier stack remains on the silicon wafer 300 are active regions 320. Individual or multiple active devices can subsequently be formed in the active regions 320 of the substrate 300.

Figure 3E:
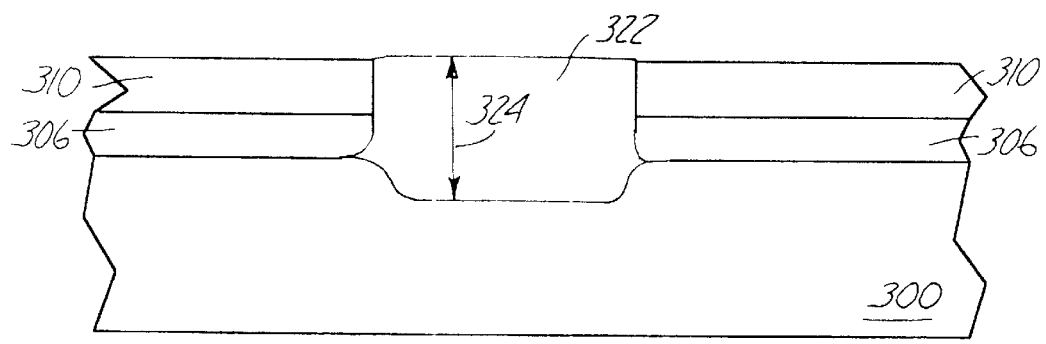
FIG. 3E is a cross-sectional representation of the structure of FIG. 3D, wherein field oxide is formed in field regions of the substrate between the patterned stack.

Field oxide 322 is then formed in the field regions 318, resulting in the structure illustrated in FIG. 3E. The thickness 324 of the field oxide 322 is governed by the device density and operating voltages of individual devices later formed in the active regions 320 illustrated in FIG. 3D. Typically, the thickness 324 of the field oxide layer 322 is about a few thousand angstroms. The thickness 324 of the field oxide layer 322, however, is not critical to the practice of this invention.

As compared to the first and second embodiments of the invention, this third embodiment is preferably used when process complexity is a concern. Due to the elimination of the pad oxide layer used in both the first and second embodiments and elimination of the first silicon nitride layer of the second embodiment, process efficiency is increased. The pad oxide layer is not necessary in this third embodiment due to the use of inorganic ARC material of the present invention. Such ARC material provides a lower stress interface with the underlying silicon substrate because it is silicon-rich. Thus, it has been found that a pad oxide layer is not necessary to relieve excess stress at the silicon interface, as is usually seen at the interface between silicon nitride and the silicon wafer.

Figure 4A:
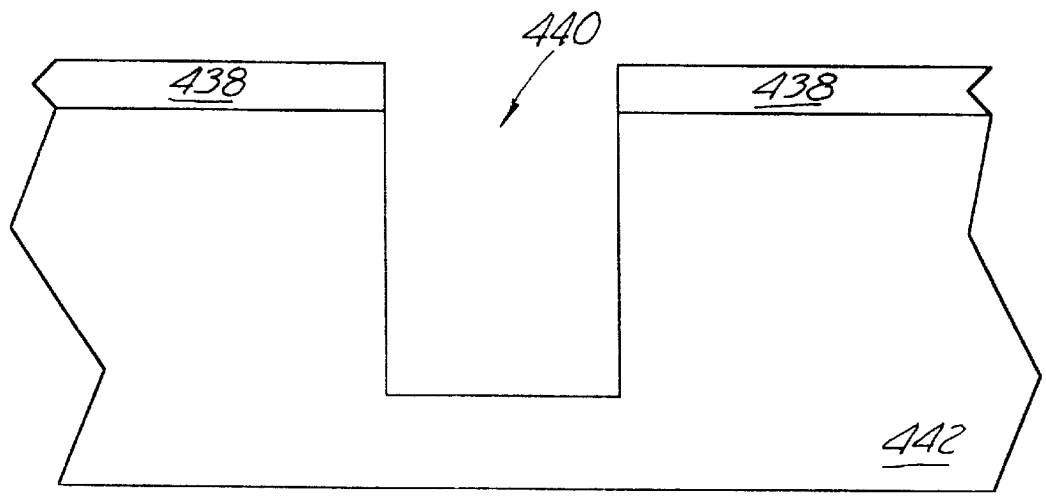
FIGS. 4A and 4B are cross-sectional representations of a method of trench isolation in accordance with the present invention.
Figure 4B:
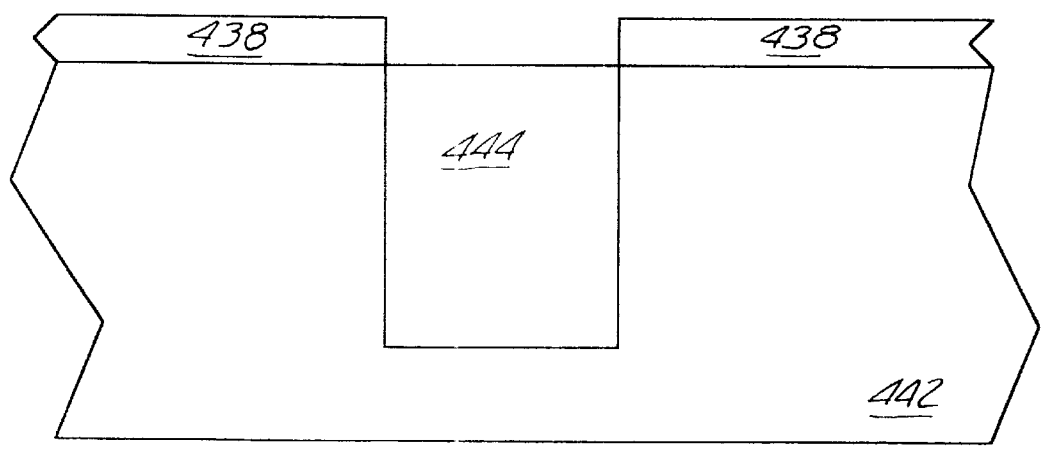

All patents disclosed herein are incorporated by reference in their entirety, as if individually incorporated. The foregoing detailed description, illustrations, and examples have been given for clarity of understanding only. No unnecessary limitations are to be understood therefrom. The invention is not limited to the exact details shown and described, for variations obvious to one skilled in the art will be included within the invention defined by the claims. For example, while the present invention has been described with reference and illustration supporting a LOCOS process, other isolation techniques can benefit from the use of the present invention. For example, trench isolation (the method for forming such trenches is illustrated in FIGS. 4A and 4B) can benefit from oxidation diffusion barrier stacks, represented generally as 438, of the present invention. As illustrated in FIG. 4A, in trench isolation, a trench 440 is etched in the substrate assembly 442 through the oxidation diffusion barrier stack 438. The trench 440 is then filled with deposited oxide 444, as illustrated in FIG. 4B. Trench isolation is referred to as shallow trench isolation (STI) or deep trench isolation (DTI), depending on the thickness of the trench etched in the substrate assembly.

As described, the oxidation diffusion barrier stack of the present invention is utilized in the photolithography step that defines regions in the substrate assembly to be etched for providing the trench 440. The method of forming trench isolation includes providing a semiconductor substrate assembly; forming an oxidation diffusion barrier stack having an inorganic antireflective material on the semiconductor substrate assembly; patterning the oxidation diffusion barrier stack resulting in exposed regions of the semiconductor substrate assembly; etching a trench in the semiconductor substrate assembly as defined by the patterned stack; and depositing oxide in the trench of the semiconductor substrate assembly.

After the oxide is deposited, it is patterned so that it can be removed from areas of the substrate outside of the trench etched in the substrate. Conventional photolithography is utilized to pattern the oxide. Once again, the oxidation diffusion barrier stack of the present invention can be utilized in this photolithography step. A wide variety of other uses are also suitable for use of the present invention.

What is claimed is:

1. A method for use in forming isolation for an integrated circuit, the method comprising:

providing a semiconductor substrate;
   forming an oxidation diffusion barrier stack on the semiconductor substrate, wherein forming the oxidation diffusion barrier stack comprises:
      forming an inorganic antireflective material layer on and in contact with the semiconductor substrate, wherein the antireflective material layer comprises a layer of silicon-rich silicon nitride, and
      forming an oxidation diffusion barrier layer on and in contact with the inorganic antireflective material layer;
   patterning the oxidation diffusion barrier stack resulting in exposed regions of the semiconductor substrate; and
   oxidizing the exposed regions of the semiconductor substrate.

2. The method of claim 1, wherein the antireflective material layer comprises an antireflective material layer having an index of refraction of about 1.7 to about 3.0.

3. The method of claim 1, wherein the antireflective material layer comprises an antireflective material layer having an absorptive coefficient of about 0.2 to about 2.0.

4. The method of claim 1, wherein the inorganic antireflective material layer has a thickness of about 100 angstroms to about 500 angstroms.

5. The method of claim 4, wherein the oxidation diffusion barrier layer has a thickness less than about 3000 angstroms.

6. The method of claim 1, wherein the oxidation diffusion barrier layer comprises a layer of one of silicon nitride and silicon oxynitride.

7. A method for use in forming isolation for an integrated circuit, the method comprising:

providing a semiconductor substrate;
   forming an oxidation diffusion barrier stack on the semiconductor substrate, wherein forming the oxidation diffusion barrier stack comprises:
      forming a pad oxide layer on and in contact with the semiconductor substrate,
      forming the inorganic antireflective material layer on and in contact with the pad oxide layer, wherein the antireflective material layer comprises a layer of silicon-rich silicon nitride, and
      forming an oxidation diffusion barrier layer on and in contact with the inorganic antireflective material layer;
   patterning the oxidation diffusion barrier stack resulting in exposed regions of the semiconductor substrate; and
   oxidizing the exposed regions of the semiconductor substrate.

8. The method of claim 7, wherein the antireflective material layer comprises an antireflective material layer having an index of refraction of about 1.7 to about 3.0.

9. The method of claim 7, wherein the antireflective material layer comprises an antireflective material layer having an absorptive coefficient of about 0.2 to about 2.0.

10. The method of claim 7, wherein the inorganic antireflective material layer has a thickness of about 100 angstroms to about 500 angstroms.

11. The method of claim 10, wherein the oxidation diffusion barrier layer has a thickness less than about 3000 angstroms.

12. The method of claim 7, wherein the oxidation diffusion barrier layer comprises a layer of one of silicon nitride and silicon oxynitride.

13. A method for use in forming isolation for an integrated circuit, the method comprising:

providing a semiconductor substrate;
   forming an oxidation diffusion barrier stack on the semiconductor substrate, wherein forming the oxidation diffusion barrier stack comprises:
      forming a pad oxide layer on and in contact with the semiconductor substrate,
      forming a first oxidation diffusion barrier layer on and in contact with the pad oxide layer,
      forming an inorganic antireflective material layer on and in contact with the first oxidation diffusion barrier layer, wherein the antireflective material layer comprises a silicon-rich layer of material selected from the group consisting of silicon nitride, silicon oxide, and silicon oxynitride, and
      forming a second oxidation diffusion barrier layer on and in contact with the inorganic antireflective material layer;
   patterning the oxidation diffusion barrier stack resulting in exposed regions of the semiconductor substrate; and
   oxidizing the exposed regions of the semiconductor substrate.

14. The method of claim 13, wherein the step of patterning the oxidation diffusion barrier stack comprises continuously flowing at least a fluorocarbon gas in a plasma reactor containing the oxidation diffusion barrier stack to remove portions of the oxidation diffusion barrier stack.

15. The method of claim 13, wherein the antireflective material layer comprises a layer of silicon-rich silicon oxide.

16. The method of claim 13, wherein the antireflective material layer comprises a layer of silicon-rich silicon nitride.

17. The method of claim 13, wherein the antireflective material layer comprises a layer of silicon-rich silicon oxynitride.

18. The method of claim 13, wherein the antireflective material layer comprises an antireflective material layer having an index of refraction of about 1.7 to about 3.0.

19. The method of claim 13, wherein the antireflective material layer comprises an antireflective material layer having an absorptive coefficient of about 0.2 to about 2.0.

20. The method of claim 13, wherein the inorganic antireflective material layer has a thickness of about 100 angstroms to about 500 angstroms.

21. The method of claim 20, wherein the oxidation diffusion barrier layer has a thickness less than about 3000 angstroms.

22. The method of claim 13, wherein the oxidation diffusion barrier layer comprises a layer of one of silicon nitride and silicon oxynitride.

23. A method for use in forming isolation for an integrated circuit, the method comprising:

providing a semiconductor substrate assembly;
   forming an oxidation diffusion barrier stack comprising an inorganic antireflective material on and in contact with the semiconductor substrate assembly, wherein the inorganic antireflective material layer comprises a silicon-rich layer of material selected from the group consisting of silicon nitride, silicon oxide, and silicon oxynitride;
   patterning the oxidation diffusion barrier stack resulting in exposed regions of the semiconductor substrate assembly;

etching a trench in the semiconductor substrate assembly through the oxidation diffusion barrier stack; and depositing an insulating material in the trench of the semiconductor substrate assembly.

24. A method for use in forming isolation for an integrated circuit, the method comprising:

providing a semiconductor substrate;

forming an oxidation diffusion barrier stack on the semiconductor substrate, wherein forming the oxidation diffusion barrier stack comprises:

forming an inorganic antireflective material layer on and in contact with the semiconductor substrate, wherein the antireflective material layer comprises a layer of silicon-rich silicon oxide, and forming an oxidation diffusion barrier layer on and in contact with the inorganic antireflective material layer;

patterning the oxidation diffusion barrier stack resulting in exposed regions of the semiconductor substrate; and oxidizing the exposed regions of the semiconductor substrate.

25. The method of claim 24, wherein the antireflective material layer comprises an antireflective material layer having an index of refraction of about 1.7 to about 3.0.

26. The method of claim 24, wherein the antireflective material layer comprises an antireflective material layer having an absorptive coefficient of about 0.2 to about 2.0.

27. The method of claim 24, wherein the inorganic antireflective material layer has a thickness of about 100 angstroms to about 500 angstroms.

28. The method of claim 27, wherein the oxidation diffusion barrier layer has a thickness less than about 3000 angstroms.

29. The method of claim 24, wherein the oxidation diffusion barrier layer comprises a layer of one of silicon nitride and silicon oxynitride.

30. A method for use in forming isolation for an integrated circuit, the method comprising:

providing a semiconductor substrate;

forming an oxidation diffusion barrier stack on the semiconductor substrate, wherein forming the oxidation diffusion barrier stack comprises:

forming an inorganic antireflective material layer on and in contact with the semiconductor substrate, wherein the antireflective material layer comprises a layer of silicon-rich silicon oxynitride, and forming an oxidation diffusion barrier layer on and in contact with the inorganic antireflective material layer;

patterning the oxidation diffusion barrier stack resulting in exposed regions of the semiconductor substrate; and oxidizing the exposed regions of the semiconductor substrate.

31. The method of claim 30, wherein the antireflective material layer comprises an antireflective material layer having an index of refraction of about 1.7 to about 3.0.

32. The method of claim 30, wherein the antireflective material layer comprises an antireflective material layer having an absorptive coefficient of about 0.2 to about 2.0.

33. The method of claim 30, wherein the inorganic antireflective material layer has a thickness of about 100 angstroms to about 500 angstroms.

34. The method of claim 33, wherein the oxidation diffusion barrier layer has a thickness less than about 3000 angstroms.

35. The method of claim 30, wherein the oxidation diffusion barrier layer comprises a layer of one of silicon nitride and silicon oxynitride.

36. A method for use in forming isolation for an integrated circuit, the method comprising:

providing a semiconductor substrate;

forming an oxidation diffusion barrier stack on the semiconductor substrate, wherein forming the oxidation diffusion barrier stack comprises:

forming a pad oxide layer on and in contact with the semiconductor substrate, forming an inorganic antireflective material layer on and in contact with the pad oxide layer, wherein the antireflective material layer comprises a layer of silicon-rich silicon oxide, and forming an oxidation diffusion barrier layer on and in contact with the inorganic antireflective material layer;

patterning the oxidation diffusion barrier stack resulting in exposed regions of the semiconductor substrate; and oxidizing the exposed regions of the semiconductor substrate.

37. The method of claim 36, wherein the antireflective material layer comprises an antireflective material layer having an index of refraction of about 1.7 to about 3.0.

38. The method of claim 36, wherein the antireflective material layer comprises an antireflective material layer having an absorptive coefficient of about 0.2 to about 2.0.

39. The method of claim 36, wherein the inorganic antireflective material layer has a thickness of about 100 angstroms to about 500 angstroms.

40. The method of claim 39, wherein the oxidation diffusion barrier layer has a thickness less than about 3000 angstroms.

41. The method of claim 36, wherein the oxidation diffusion barrier layer comprises a layer of one of silicon nitride and silicon oxynitride.

42. A method for use in forming isolation for an integrated circuit, the method comprising:

providing a semiconductor substrate;

forming an oxidation diffusion barrier stack on the semiconductor substrate, wherein forming the oxidation diffusion barrier stack comprises:

forming a pad oxide layer on and in contact with the semiconductor substrate, forming an inorganic antireflective material layer on and in contact with the pad oxide layer, wherein the antireflective material layer comprises a layer of silicon-rich silicon oxynitride, and forming an oxidation diffusion barrier layer on and in contact with the inorganic antireflective material layer;

patterning the oxidation diffusion barrier stack resulting in exposed regions of the semiconductor substrate; and oxidizing the exposed regions of the semiconductor substrate.

43. The method of claim 42, wherein the antireflective material layer comprises an antireflective material layer having an index of refraction of about 1.7 to about 3.0.

44. The method of claim 42, wherein the antireflective material layer comprises an antireflective material layer having an absorptive coefficient of about 0.2 to about 2.0.

45. The method of claim 42, wherein the inorganic antireflective material layer has a thickness of about 100 angstroms to about 500 angstroms.

46. The method of claim 45, wherein the oxidation diffusion barrier layer has a thickness less than about 3000 angstroms.

47. The method of claim 42, wherein the oxidation diffusion barrier layer comprises a layer of one of silicon nitride and silicon oxynitride.

* * * * *

UNITED STATES PATENT AND TRADEMARK OFFICE
CERTIFICATE OF CORRECTION

PATENT NO. : 6,423,631 B1
DATED : July 23, 2002
INVENTOR(S) : Iyer et al.

It is certified that error appears in the above-identified patent and that said Letters Patent is hereby corrected as shown below:

<u>Title page,</u>
Item [63], Related U.S. Application Data, please delete "Continuation" and replace with -- Divisional --;
Item [56], References Cited, U.S. PATENT DOCUMENTS, reference "5,747,388," please delete "Kësters" and insert -- Küsters --; and reference "6,103,456," please delete "Tëbben" and insert -- Többen --;

<u>Column 1,</u>
Line 4, please delete "continuation" and replace with -- divisional --;

<u>Column 11,</u>
Please delete claim 7;
Please delete claim 8;
Please delete claim 9;
Please delete claim 10;
Please delete claim 11;

<u>Column 12,</u>
Please delete claim 12;
Please delete claim 13;
Please delete claim 14;
Please delete claim 15;
Please delete claim 16;
Please delete claim 17;
Please delete claim 18;
Please delete claim 19;
Please delete claim 20;
Please delete claim 21;
Please delete claim 22;

<u>Column 13,</u>
Please delete claim 36;

UNITED STATES PATENT AND TRADEMARK OFFICE
CERTIFICATE OF CORRECTION

PATENT NO.   : 6,423,631 B1
DATED        : July 23, 2002
INVENTOR(S)  : Iyer et al.

It is certified that error appears in the above-identified patent and that said Letters Patent is hereby corrected as shown below:

Column 14,
Please delete claim 37;
Please delete claim 38;
Please delete claim 39;
Please delete claim 40;
Please delete claim 41;
Please delete claim 42;
Please delete claim 43;
Please delete claim 44;
Please delete claim 45;
Please delete claim 46;
Please delete claim 47.

Signed and Sealed this

First Day of April, 2003

JAMES E. ROGAN
*Director of the United States Patent and Trademark Office*